(12) United States Patent
Tsai et al.

(10) Patent No.: US 12,105,142 B2
(45) Date of Patent: Oct. 1, 2024

(54) METHOD AND SYSTEM FOR CREATING DIPOLE MOMENT MODEL

(71) Applicant: Realtek Semiconductor Corporation, Hsinchu (TW)

(72) Inventors: Min-Hsu Tsai, Hsinchu County (TW); Ruey-Beei Wu, Taipei (TW)

(73) Assignee: Realtek Semiconductor Corporation, Hsinchu (TW)

( * ) Notice: Subject to any disclaimer, the term of this patent is extended or adjusted under 35 U.S.C. 154(b) by 400 days.

(21) Appl. No.: 17/659,012

(22) Filed: Apr. 13, 2022

(65) Prior Publication Data

US 2023/0103493 A1    Apr. 6, 2023

(30) Foreign Application Priority Data

Oct. 6, 2021   (TW) .................................. 110137131

(51) Int. Cl.
| | |
|---|---|
| *G01V 3/10* | (2006.01) |
| *G01R 31/317* | (2006.01) |
| *H01Q 7/00* | (2006.01) |
| *H04B 5/73* | (2024.01) |

(52) U.S. Cl.
CPC ......... *G01R 31/31702* (2013.01); *H01Q 7/00* (2013.01); *H04B 5/73* (2024.01)

(58) Field of Classification Search
CPC ....................... G01R 31/31702; G01R 29/0892
See application file for complete search history.

(56) References Cited

U.S. PATENT DOCUMENTS

| | | | |
|---|---|---|---|
| 2004/0262210 A1* | 12/2004 | Westervelt ........ | B01L 3/502792 210/695 |
| 2017/0123291 A1* | 5/2017 | Vampa ................. | G02F 1/3556 |
| 2017/0350929 A1* | 12/2017 | Vampa ..................... | G02F 1/37 |
| 2020/0081449 A1* | 3/2020 | Albelo .................... | G01S 7/487 |

* cited by examiner

*Primary Examiner* — Thang X Le
(74) *Attorney, Agent, or Firm* — CKC & Partners Co., LLC

(57) ABSTRACT

The present disclosure provides a method and system for creating dipole moment model. The method is applied to a tested circuit and includes: performing a near-field measurement on the tested circuit, to obtain a near-field electric field and a near-field magnetic field related to the tested circuit; performing a two-dimensional divergence calculation on the near-field electric field and the near-field magnetic field, to obtain a near-field electric divergence field and a near-field magnetic divergence field; performing a convolution calculation on the near-field electric divergence field and the near-field magnetic divergence field with a digital filter; and building a dipole moment matrix equivalent to the tested circuit according to a result of the convolution calculation.

16 Claims, 7 Drawing Sheets

METHOD AND SYSTEM FOR CREATING DIPOLE MOMENT MODEL

CROSS-REFERENCE TO RELATED APPLICATION

This application claims priority to Taiwan Application Serial Number 110137131, filed Oct. 6, 2021, which is herein incorporated by reference in its entirety.

BACKGROUND

Field of Invention

This disclosure relates to a method and system for creating dipole moment model, and in particular to a method and system which create the dipole moment model by analyzing divergence field.

Description of Related Art

The known method for creating dipole moment model requires performing a calculation of pseudo inverse matrix with the measured electromagnetic field by utilizing a tensor matrix, so as to convert the electromagnetic field into a dipole moment model equivalent to a tested circuit. Since the known method can easily generate inaccurate quantity value of the dipole moment due to the noise interference, the known method further utilizes regularization parameter to reduce the noise interference. However, there is no criterion to select the regularization parameter. In practical, multiple parameters are utilized to perform the calculation, and a result with the smallest error is then selected from multiple calculation results, so as to find the appropriate regularization parameter. Therefore, the known method has a large calculation amount and a long calculation time, which is inconvenient for the user.

SUMMARY

An aspect of present disclosure relates to a method for creating dipole moment model. The method is applied to a tested circuit and includes: performing a near-field measurement on the tested circuit, to obtain a near-field electric field and a near-field magnetic field related to the tested circuit; performing a two-dimensional divergence calculation on the near-field electric field and the near-field magnetic field, to obtain a near-field electric divergence field and a near-field magnetic divergence field; performing a convolution calculation on the near-field electric divergence field and the near-field magnetic divergence field with a digital filter; and building a dipole moment matrix equivalent to the tested circuit according to a result of the convolution calculation.

Another aspect of present disclosure relates to a system for creating dipole moment model. The system is applied to a tested circuit, and includes an electromagnetic scanner and a processing device. The electromagnetic scanner is configured to perform a near-field measurement on the tested circuit, to obtain a near-field electric field and a near-field magnetic field related to the tested circuit. The processing device is coupled to the electromagnetic scanner and configured to: perform a two-dimensional divergence calculation on the near-field electric field and the near-field magnetic field, to obtain a near-field electric divergence field and a near-field magnetic divergence field; perform a convolution calculation on the near-field electric divergence field and the near-field magnetic divergence field with a digital filter; and building a dipole moment matrix equivalent to the tested circuit according to a result of the convolution calculation.

DETAILED DESCRIPTION

The embodiments are described in detail below with reference to the appended drawings to better understand the aspects of the present disclosure. However, the provided embodiments are not intended to limit the scope of the disclosure, and the description of the structural operation is not intended to limit the order in which they are performed. Any device that has been recombined by components and produces an equivalent function is within the scope covered by the disclosure.

The terms used in the entire specification and the scope of the patent application, unless otherwise specified, generally have the ordinary meaning of each term used in the field, the content disclosed herein, and the particular content.

The terms "coupled" or "connected" as used herein may mean that two or more elements are directly in physical or electrical contact, or are indirectly in physical or electrical contact with each other. It can also mean that two or more elements interact with each other.

Figure 1:
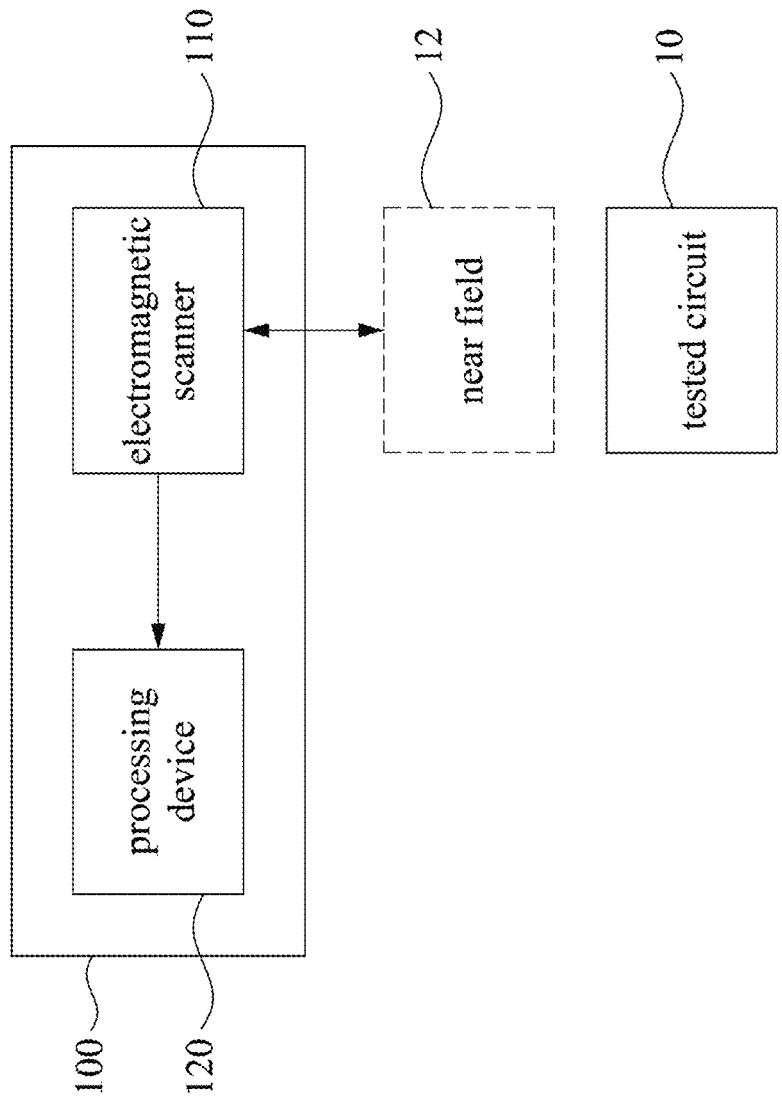
FIG. 1 is a block diagram of a system for creating dipole moment model in accordance with some embodiments of the present disclosure.

Referring to FIG. 1, FIG. 1 is a block diagram of a system 100 for creating dipole moment model in accordance with some embodiments of the present disclosure. The system 100 includes an electromagnetic scanner 110 and a processing device 120. In some embodiments, the system 100 builds a dipole moment matrix (not shown) equivalent to a tested circuit 10 by measuring an electromagnetic field generated in a near field 12 by the tested circuit 10. Since the distribution of a plurality of dipole moments in the equivalent dipole moment matrix is related to different signal sources (e.g., noise source) on the tested circuit 10, the operator of the system 100 may find the noise source on the tested circuit 10 according to the equivalent dipole moment matrix.

As shown in FIG. 1, the electromagnetic scanner 110 is electrically coupled to the processing device 120 and is configured to perform a near-field measurement on the tested circuit 10, to obtain the distribution of the electromagnetic field generated in the near field 12 by the tested circuit 10. In some embodiments, the near field 12 is at a plane at a predetermined height (for example but not limited to be 50 mil) above a ground plane (not shown) of the tested circuit 10. The processing device 120 is configured to receive and analyze the measurement result of the electromagnetic scanner 110, to build the dipole moment matrix equivalent to the tested circuit 10. In some embodiments, the processing device 120 can be implemented by a desktop computer, a laptop computer or other suitable electronic computer, however, the present disclosure is not limited herein.

Figure 2:
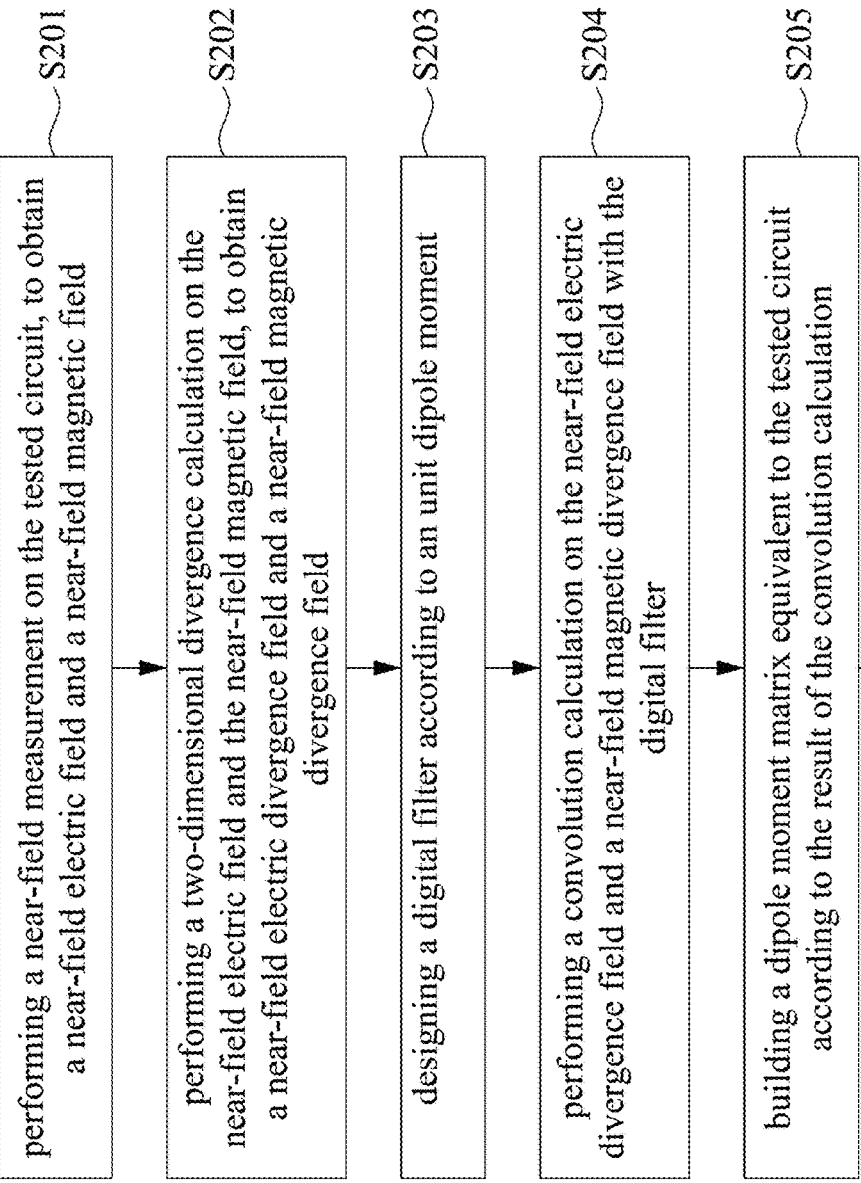
FIG. 2 is a flow diagram of a method for creating dipole moment model in accordance with some embodiments of the present disclosure.

Referring to FIG. 2, FIG. 2 is a flow diagram of a method 200 for creating dipole moment model in accordance with some embodiments of the present disclosure. The method 200 can be executed by the system 100 of FIG. 1. In some embodiments, the method 200 includes operations S201-S205. For convenience of description, the method 200 would be described below with reference to FIGS. 1-7.

In operation S201, the electromagnetic scanner 110 performs the near-field measurement on the tested circuit 10, to obtain a near-field electric field (not shown) and a near-field magnetic field (not shown). In particular, the near-field electric field is an electric field generated in the near field 12 by different signal sources on the tested circuit 10, and the near-field magnetic field is a magnetic field generated in the near field 12 by different signal sources on the tested circuit 10. In other words, the near-field electric field and the near-field magnetic field are related to the tested circuit 10.

After the processing device 120 receives the measurement result of the electromagnetic scanner 110, operation S202 is performed. In operation S202, the processing device 120 performs a two-dimensional divergence calculation on the near-field electric field and the near-field magnetic field, to obtain a near-field electric divergence field (not shown) and a near-field magnetic divergence field (not shown). The terms "two-dimensional divergence calculation" as used herein can be understood by person having ordinary skill in the art of the present disclosure, and therefore the descriptions thereof are omitted herein.

Figure 3:
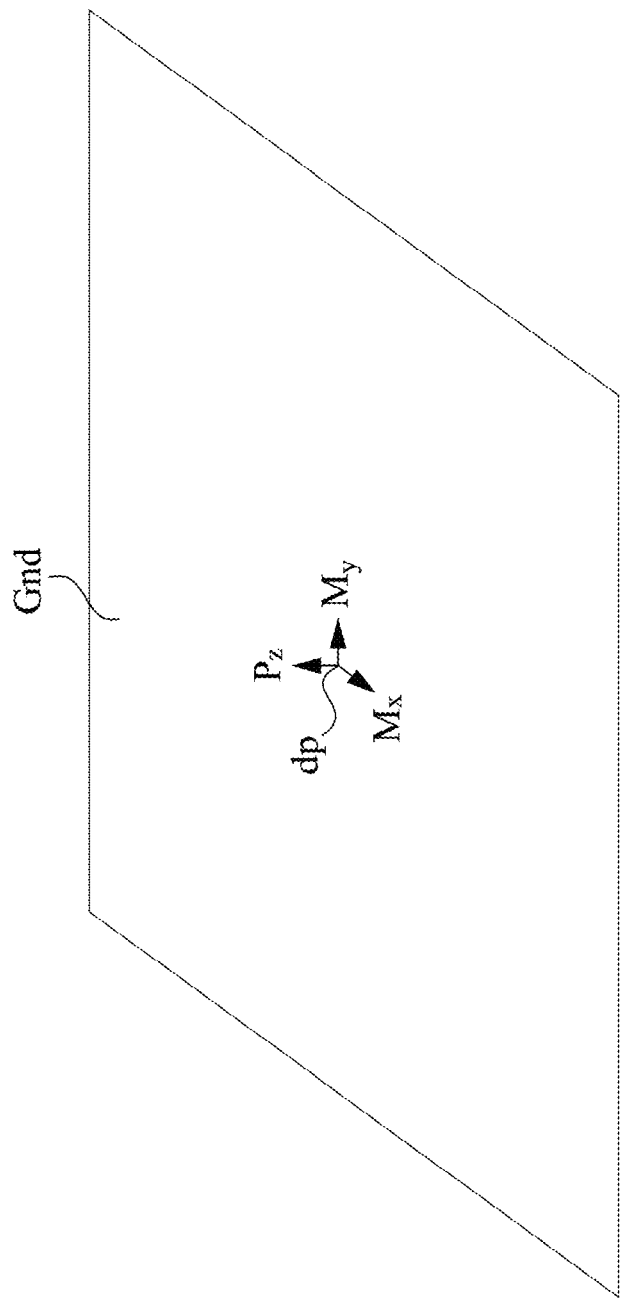
FIG. 3 is a schematic diagram of a unit dipole moment in accordance with some embodiments of the present disclosure.

In operation S203, the processing device 120 designs a digital filter according to an ideal unit dipole moment (e.g., dp in FIG. 3). Notably, the processing device 120 can perform the calculation with the digital filter, to generate the dipole moment matrix equivalent to the tested circuit 10. In some embodiments, the digital filter is a finite impulse response filter. In addition, since the dipole moments of the dipole moment matrix equivalent to the tested circuit 10 may include three components perpendicular to each other (i.e., a magnetic dipole moment in a Y-direction, a magnetic dipole moment in an X-direction, and an electric dipole moment in a Z-direction), the digital filter designed by the processing device 120 also includes three sub-filters (which would be described in detail later) correspondingly, to generate the equivalent dipole moment matrix.

Referring to FIG. 3, FIG. 3 is a schematic diagram of the ideal unit dipole moment dp in accordance with some embodiments of the present disclosure. Similar to the dipole moments of the dipole moment matrix equivalent to the tested circuit 10, the unit dipole moment dp for designing the digital filter also includes three components perpendicular to each other. As shown in FIG. 3, the unit dipole moment dp includes an unit magnetic dipole moment $M_x$ (e.g., 1 A*m$^2$), an unit magnetic dipole moment $M_y$ and an unit electric dipole moment $P_z$. The unit magnetic dipole moment $M_x$, the unit magnetic dipole moment $M_y$ and the unit electric dipole moment $P_z$ are perpendicular to each other.

Notably, the present disclosure designs the digital filter by analyzing a variety of fields that the unit dipole moment dp generates in the same condition as the tested circuit 10 (or the near-field measurement), to apply the digital filter to a variety of fields (e.g., the near-field electric divergence field and the near-field magnetic divergence field generated in operation S202) obtained by measuring the tested circuit 10. In other words, the unit dipole moment dp is assumed to be at a position corresponding to the electronic elements (or signal sources) on the tested circuit 10, and the analysis is performed based on a variety of fields generated at a position corresponding to the near field 12 by the unit dipole moment dp.

In some practical applications, the electronic elements on the tested circuit 10 is at about 10 mil height above the ground plane of the tested circuit 10, and the electromagnetic field measured by the electromagnetic scanner 110 is at the near field 12 at about 50 mil height above the ground plane of the tested circuit 10. Accordingly, it is assumed that the unit dipole moment dp is at a position at about 5 mil height above a ground plane Gnd, and a variety of fields generated at a plane (not shown) at about 50 mil height above the ground plane Gnd by the unit dipole moment dp would be analyzed.

The design of three sub-filters (i.e., a first sub-filter, a second sub-filter and a third sub-filter which are described later) of the digital filter would be described below in detail.

During the design of the first sub-filter, the processing device 120 first calculates a simulation electric field (not shown) according to the unit electric dipole moment $P_z$. As above descriptions, the simulation electric field is at the plane at about 50 mil height above the ground plane Gnd. In addition, the simulation electric field can be calculated by the theory (e.g., Maxwell's equation) well known by person having ordinary skill in the art of the present disclosure, and therefore the descriptions thereof are omitted herein.

Figure 4:
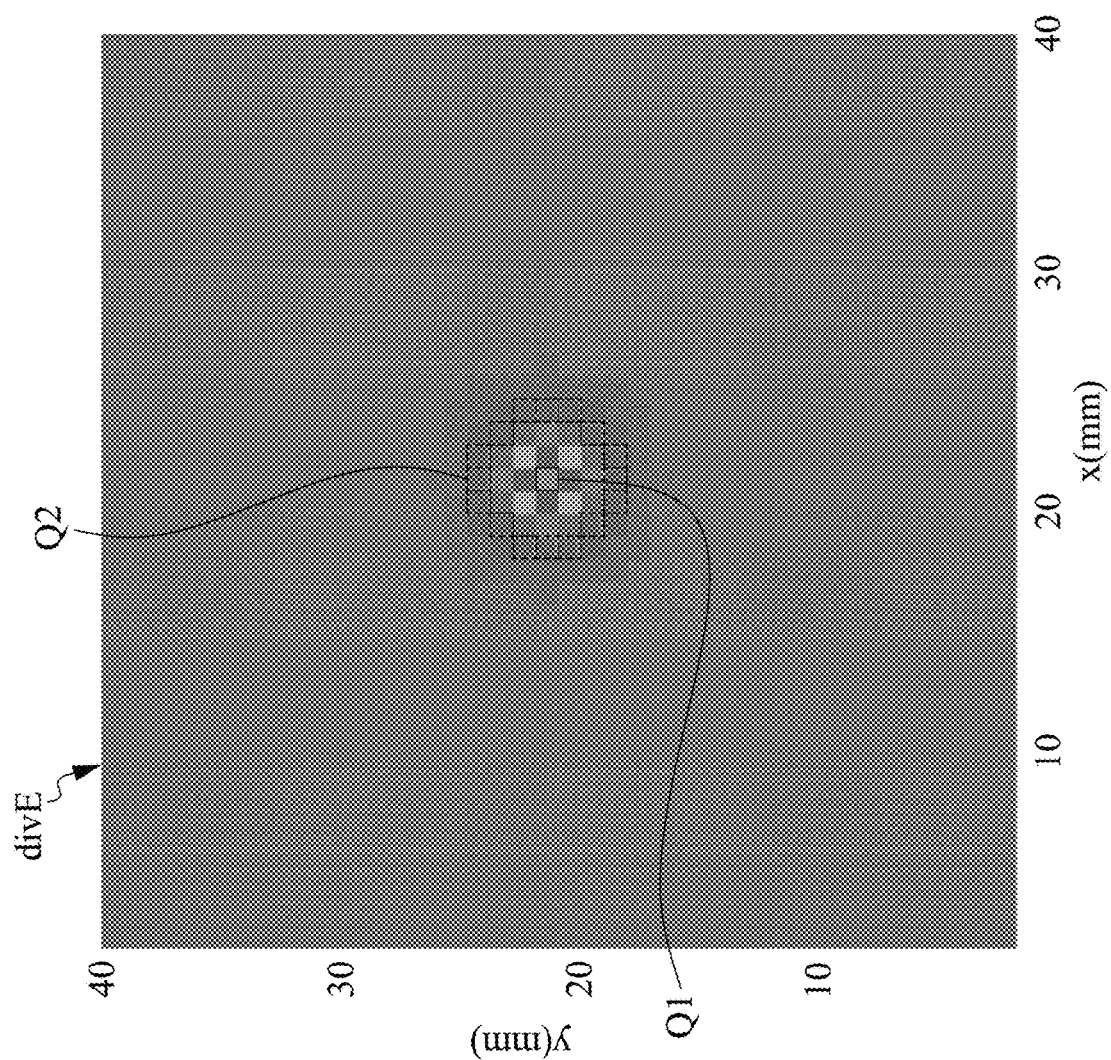
FIG. 4 is a schematic diagram of a simulation electric divergence field in accordance with some embodiments of the present disclosure.

The processing device 120 then performs the two-dimensional divergence calculation on the simulation electric field, to obtain a simulation electric divergence filed (e.g., divE in FIG. 4). Referring to FIG. 4, FIG. 4 is a schematic diagram of the simulation electric divergence filed divE in accordance with some embodiments of the present disclosure. It can be appreciated that different grayscale levels in the simulation electric divergence filed divE represent different field intensity values respectively. In the embodiments of FIG. 4, the simulation electric divergence filed divE calculated by the processing device 120 has a maximum value in a central zone Q1 (which is represented by solid lines), and a minimum value of the simulation electric divergence filed divE is in a peripheral zone Q2 (which is represented by broken lines) surrounding the central zone Q1. In some embodiments, the minimum value of the simulation electric divergence filed divE is negative value.

Figure 5:
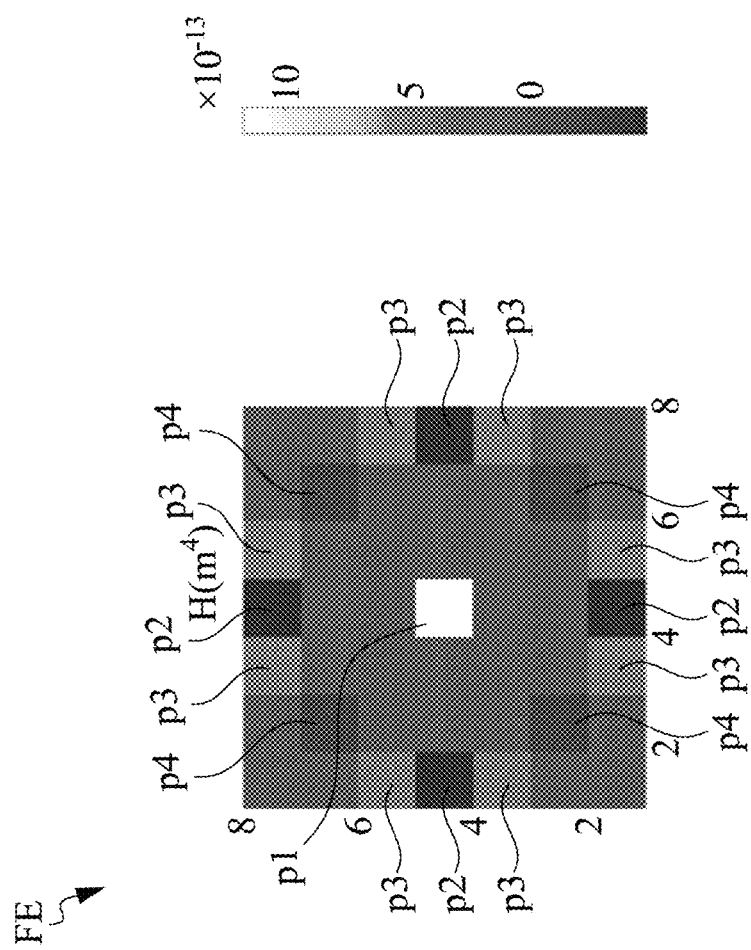
FIG. 5 is a schematic diagram of a first sub-filter in accordance with some embodiments of the present disclosure.

Accordingly, the processing device 120 determines a shape and coefficients of the first sub-filter (e.g., FE in FIG. 5) according to the simulation electric divergence filed divE. Referring to FIG. 5, FIG. 5 is a schematic diagram of the first sub-filter FE in accordance with some embodiments of the present disclosure. In the embodiments of FIG. 5, the shape of the first sub-filter FE is formed by a central zone p1, four first peripheral zones p2, eight second peripheral zones p3 and four third peripheral zones p4. In particular, each of the first peripheral zones p2 is at two units from the central zone p1, each of the first peripheral zones p2 is immediate to two of the second peripheral zones p3, and each of the third peripheral zones p4 is arranged diagonally to the central zone p1.

According to FIGS. 4 and 5, the central zone p1 of the first sub-filter FE is corresponding to the central zone Q1 of the simulation electric divergence filed divE, and a zone merged by the first peripheral zones p2, the second peripheral zones p3 and the third peripheral zones p4 is corresponding to the peripheral zone Q2 of the simulation electric divergence filed divE. In other words, the shape of the first sub-filter FE is determined according to the field intensity distribution of the simulation electric divergence filed divE.

After determining the shape of the first sub-filter FE (i.e., after the central zone p1, first peripheral zones p2, the second peripheral zones p3 and the third peripheral zones p4 are arranged), the processing device 120 can calculate a first coefficient corresponding to the central zone p1, a second coefficient corresponding to the first peripheral zone p2, a third coefficient corresponding to the second peripheral zone p3 and a fourth coefficient corresponding to the third peripheral zone p4.

In some embodiments, the processing device 120 can obtain the magnitude of the unit electric dipole moment $P_Z$ after performing convolution calculation on the simulation electric divergence filed divE with the first sub-filter FE. According to this relationship, the processing device 120 can calculate the first, second, third and fourth coefficients of the first sub-filter FE by least square method. In some practical applications, the first coefficient of the first sub-filter FE is $7.98 \times 10^{-13}$, the second coefficient of the first sub-filter FE is $-4.62 \times 10^{-14}$, the third coefficient of the first sub-filter FE is $8.78 \times 10^{-14}$, and the fourth coefficient of the first sub-filter FE is $-5.65 \times 10^{-15}$. In the embodiments of FIG. 5, the coefficient, the magnitude or the numeral value corresponding to other zones (i.e., the zones which do not belong to p1, p2, p3 and p4) of the first sub-filter FE is 0.

During the design of the second sub-filter, the processing device 120 first calculates a simulation magnetic field (not shown) according to the unit magnetic dipole moment $M_x$. As above descriptions, the simulation magnetic field is at the plane at about 50 mil height above the ground plane Gnd. In addition, the simulation magnetic field can be calculated by the theory (e.g., Maxwell's equation) well known by person having ordinary skill in the art of the present disclosure, and therefore the descriptions thereof are omitted herein.

Figure 6:
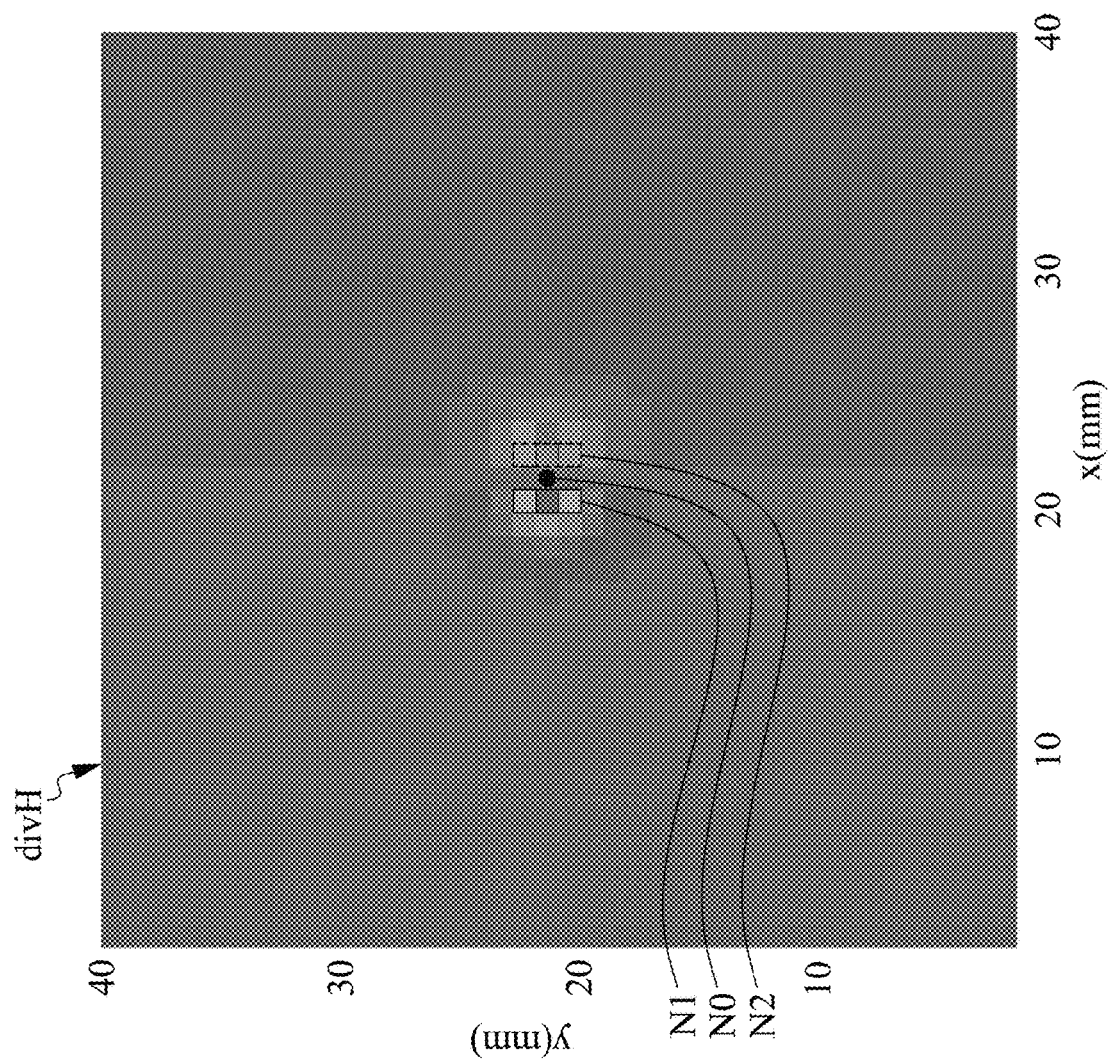
FIG. 6 is a schematic diagram of a simulation magnetic divergence field in accordance with some embodiments of the present disclosure.

The processing device 120 then performs the two-dimensional divergence calculation on the simulation magnetic field, to obtain a simulation magnetic divergence filed (e.g., divH in FIG. 6). Referring to FIG. 6, FIG. 6 is a schematic diagram of the simulation magnetic divergence filed divH in accordance with some embodiments of the present disclosure. It can be appreciated that different grayscale levels in the simulation magnetic divergence filed divH represent different field intensity values respectively. In the embodiments of FIG. 6, a maximum value of the simulation magnetic divergence filed divH is in a left zone N1 (which is represented by solid lines), and a minimum value of the simulation magnetic divergence filed divH is in a right zone N2 (which is represented by broken lines). A center point N0 in FIG. 6 is directly above a position where the unit magnetic dipole moment $M_x$ is, and the left zone N1 and the right zone N2 are respectively at two sides of the center point N0. It can be appreciated that the center point N0 does not really exist on the simulation magnetic divergence filed divH, and is only illustrated for describing the position relationship of the left zone N1 and the right zone N2.

Figure 7:
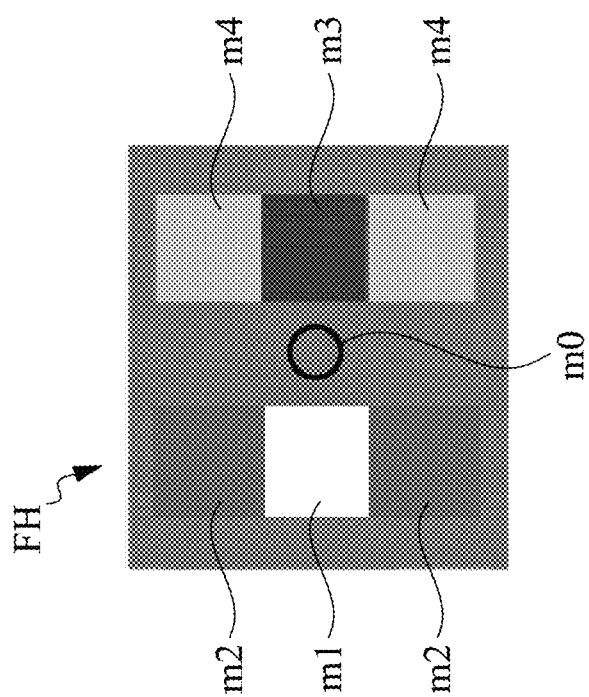
FIG. 7 is a schematic diagram of a second sub-filter in accordance with some embodiments of the present disclosure.

Accordingly, the processing device 120 determines a shape and coefficients of the second sub-filter (e.g., FH in FIG. 7) according to the simulation magnetic divergence filed divH. Referring to FIG. 7, FIG. 7 is a schematic diagram of the second sub-filter FH in accordance with some embodiments of the present disclosure. Similar to the above descriptions of first sub-filter FE, the processing device 120 determines the shape of the second sub-filter FH according to the field intensity distribution of the simulation magnetic divergence filed divH.

As shown in FIG. 7, the shape of the second sub-filter FH is formed by a left zone (which is corresponding to the left zone N1 of the simulation magnetic divergence filed divH) and a right zone (which is corresponding to the right zone N2 of the simulation magnetic divergence filed divH). In particular, the left zone and the right zone of the second sub-filter FH are respectively at two sides of a center point m0 (which is represented by hollow dot), and the center point m0 of FIG. 7 is corresponding to the center point N0 of FIG. 6. Similarly, the center point m0 does not really exist on the second sub-filter FH, and is only illustrated for describing the position relationship of the left zone and the right zone of the second sub-filter FH. In particular, the left zone of the second sub-filter FH includes a first central sub-zone m1 and two first adjacent sub-zones m2 immediate to two sides of the first central sub-zone m1, and the right zone of the second sub-filter FH includes a second central sub-zone m3 and two second adjacent sub-zones m4 immediate to two sides of the second central sub-zone m3.

After determining the shape of the second sub-filter FH (i.e., after the first central sub-zone m1, the first adjacent sub-zones m2, the second central sub-zone m3 and the second adjacent sub-zones m4 are arranged), the processing device 120 can calculate a first coefficient corresponding to the first central sub-zone m1, a second coefficient corresponding to the first adjacent sub-zone m2, a third coefficient corresponding to the second central sub-zone m3 and a fourth coefficient corresponding to the second adjacent sub-zone m4.

Similar to the above descriptions of the first sub-filter FE, the processing device 120 can obtain the magnitude of the unit magnetic dipole moment $M_x$ after performing convolution calculation on the simulation magnetic divergence filed divH with the second sub-filter FH. According to this relationship, the processing device 120 can calculate the first, second, third and fourth coefficients of the second sub-filter FH by least square method. In some practical applications, the first coefficient of the second sub-filter FH is $2.65 \times 10^{-12}$, the second coefficient of the second sub-filter FH is $-1.13 \times 10^{-12}$, the third coefficient of the second sub-filter FH is $-2.65 \times 10^{-12}$, and the fourth coefficient of the second sub-filter FH is $1.13 \times 10^{-12}$. In the embodiments of FIG. 7, the coefficient, the magnitude or the numeral value corresponding to other zones (i.e., the zones which do not belong to m1, m2, m3 and m4) of the second sub-filter FH is 0.

During the design of the third sub-filter, because the unit magnetic dipole moment $M_x$ is reversely rotated 90 degrees to be the unit magnetic dipole moment $M_y$, the processing device 120 can reversely rotate the second sub-filter FH (as shown in FIG. 7) to generate the third sub-filter (not shown). It can be appreciated that the processing device 120 can obtain the magnitude of the unit magnetic dipole moment $M_y$ after performing the convolution calculation on another simulation magnetic divergence field (not shown, different from divH of FIG. 6), which is generated through the unit magnetic dipole moment $M_y$, with the third sub-filter.

In operation S204, the processing device 120 performs the convolution calculation on the near-field electric divergence field and the near-field magnetic divergence field (which are generated in operation S202) with the digital filter (which is designed in operation S203). In particular, the processing device 120 performs the convolution calculation on the near-field electric divergence field with the first sub-filter FE, and performs the convolution calculation on the near-field magnetic divergence field with the second sub-filter FH and the third sub-filter respectively.

In operation S205, the processing device 120 builds the dipole moment matrix equivalent to the tested circuit 10 according to the result of the convolution calculation. As above descriptions, the processing device 120 generates the electric divergence field and the magnetic divergence field (e.g., the simulation electric divergence field divE and the simulation magnetic divergence field divH) correspondingly through the unit dipole moment dp in the same condition as the tested circuit 10. Furthermore, the processing device 120 performs the convolution calculation on the electric divergence field and the magnetic divergence field respectively with the digital filter designed in operation S203, to obtain the unit dipole moment dp. According to this relationship, the processing device 120 can perform the convolution calculation on the near-field electric divergence field and the near-field magnetic divergence field (which are generated in operation S202) with the digital filter (which is designed in operation S203), and can then generate the dipole moment matrix equivalent to the tested circuit 10 according to the calculation result.

In other embodiments, the near-field electric field and the near-field magnetic field measured in operation S201 may include intensity information only but miss phase information. Accordingly, the processing device 120 may further analyze the near-field electric field and the near-field magnetic field to obtain the phase information. The near-field electric field is taken as an example herein. The processing device 120 may take areas, where the field intensity value is 0 in the near-field electric field, as boundary line based on the continuity of field. Then, the processing device 120 may divide the near-field electric field into multiple blocks through the boundary line. Being limited by the range where the electromagnetic scanner 110 performs the near-field measurement, the phase of each of the blocks may be 0 or 180 degrees theoretically.

Then, the processing device 120 utilizes all possible phase combinations to the blocks of the near-field electric field and calculates multiple two-dimensional curl fields corresponding to the all possible phase combinations. The near-field electric field, which is divided into 2 blocks, is taken as an example herein. At this time, there would be 4 phase combinations (which include [0°:0°],[0°:180°],[180°:0°] and [180°:180°]), so that the processing device 120 would calculate 4 curl fields correspondingly. Because the curl field would be much smaller than the divergence field theoretically, the processing device 120 would select the smallest curl field from the multiple curl fields and take the phase combination corresponding to the smallest curl field as the phase information of the near-field electric field. The terms "smallest curl field" as used herein represents that the maximum curl value of the smallest curl field is smaller than those of other curl fields.

In sum, the method and system provided by the present disclosure design the digital filter in the same condition as the near-field measurement, and applies the digital filter to the electric and magnetic divergence fields generated by the near-field measurement to perform the calculation, so as to obtain the dipole moment model equivalent to the tested circuit. In comparison with the known method which performs the calculation of pseudo inverse matrix by utilizing the tensor matrix, the method and system provided by the present disclosure have small calculation amount, short calculation time and similar accuracy.

Although the present disclosure has been described in considerable detail with reference to certain embodiments thereof, other embodiments are possible. Therefore, the spirit and scope of the appended claims should not be limited to the description of the embodiments contained herein. It will be apparent to those skilled in the art that various modifications and variations can be made to the structure of the present disclosure without departing from the scope or spirit of the invention. In view of the foregoing, it is intended that the present invention cover modifications and variations of this invention provided they fall within the scope of the following claims.

What is claimed is:

1. A method for creating dipole moment model, applied to a tested circuit, and comprising:
    performing a near-field measurement on the tested circuit, to obtain a near-field electric field and a near-field magnetic field related to the tested circuit;
    performing a two-dimensional divergence calculation on the near-field electric field and the near-field magnetic field, to obtain a near-field electric divergence field and a near-field magnetic divergence field;
    performing a convolution calculation on the near-field electric divergence field and the near-field magnetic divergence field with a digital filter; and
    building a dipole moment matrix equivalent to the tested circuit according to a result of the convolution calculation.

2. The method for creating dipole moment model of claim 1, wherein before the operation of performing the convolution calculation, the method further comprises:
    designing the digital filter according to an unit dipole moment.

3. The method for creating dipole moment model of claim 2, wherein the operation of designing the digital filter comprises:
    calculating a simulation electric field according to an unit electric dipole moment of the unit dipole moment;
    performing the two-dimensional divergence calculation on the simulation electric field, to obtain a simulation electric divergence field; and
    determining a shape and coefficients of a first sub-filter of the digital filter according to the simulation electric divergence field, wherein the first sub-filter is configured to perform the convolution calculation with the near-field electric divergence field, to generate at least one electric dipole moment of the dipole moment matrix.

4. The method for creating dipole moment model of claim 3, wherein the operation of designing the digital filter further comprises:
    calculating a simulation magnetic field according to a first unit magnetic dipole moment of the unit dipole moment;
    performing the two-dimensional divergence calculation on the simulation magnetic field, to obtain a simulation magnetic divergence field; and
    determining a shape and coefficients of a second sub-filter of the digital filter according to the simulation magnetic divergence field, wherein the second sub-filter is configured to perform the convolution calculation with the near-field magnetic divergence field, to generate at least one first magnetic dipole moment of the dipole moment matrix.

5. The method for creating dipole moment model of claim 4, wherein the operation of designing the digital filter further comprises:
   determining a shape and coefficients of a third sub-filter of the digital filter according to the second sub-filter, wherein the third sub-filter is configured to perform the convolution calculation with the near-field magnetic divergence field, to generate at least one second magnetic dipole moment of the dipole moment matrix.

6. The method for creating dipole moment model of claim 4, wherein the coefficients of the first sub-filter and the coefficients of the second sub-filter are calculated by least square method.

7. The method for creating dipole moment model of claim 4, wherein if the near-field electric field and the near-field magnetic field are at a plane at a predetermined height above the tested circuit, the simulation electric field and the simulation magnetic field are at a plane at the predetermined height above the unit dipole moment.

8. The method for creating dipole moment model of claim 4, wherein the unit electric dipole moment and the first unit magnetic dipole moment are perpendicular to each other.

9. A system for creating dipole moment model, applied to a tested circuit, and comprising:
   an electromagnetic scanner configured to perform a near-field measurement on the tested circuit, to obtain a near-field electric field and a near-field magnetic field related to the tested circuit; and
   a processing device coupled to the electromagnetic scanner and configured to:
   perform a two-dimensional divergence calculation on the near-field electric field and the near-field magnetic field, to obtain a near-field electric divergence field and a near-field magnetic divergence field;
   perform a convolution calculation on the near-field electric divergence field and the near-field magnetic divergence field with a digital filter; and
   building a dipole moment matrix equivalent to the tested circuit according to a result of the convolution calculation.

10. The system for creating dipole moment model of claim 9, wherein before the operation of performing the convolution calculation, the processing device is further configured to:
   design the digital filter according to an unit dipole moment.

11. The system for creating dipole moment model of claim 10, wherein during the operation of designing the digital filter, the processing device is configured to:
   calculate a simulation electric field according to an unit electric dipole moment of the unit dipole moment;
   perform the two-dimensional divergence calculation on the simulation electric field, to obtain a simulation electric divergence field; and
   determine a shape and coefficients of a first sub-filter of the digital filter according to the simulation electric divergence field, wherein the first sub-filter is configured to perform the convolution calculation with the near-field electric divergence field, to generate at least one electric dipole moment of the dipole moment matrix.

12. The system for creating dipole moment model of claim 11, wherein during the operation of designing the digital filter, the processing device is configured to:
   calculate a simulation magnetic field according to a first unit magnetic dipole moment of the unit dipole moment;
   perform the two-dimensional divergence calculation on the simulation magnetic field, to obtain a simulation magnetic divergence field; and
   determine a shape and coefficients of a second sub-filter of the digital filter according to the simulation magnetic divergence field, wherein the second sub-filter is configured to perform the convolution calculation with the near-field magnetic divergence field, to generate at least one first magnetic dipole moment of the dipole moment matrix.

13. The system for creating dipole moment model of claim 12, wherein during the operation of designing the digital filter, the processing device is configured to:
   determining a shape and coefficients of a third sub-filter of the digital filter according to the second sub-filter, wherein the third sub-filter is configured to perform the convolution calculation with the near-field magnetic divergence field, to generate at least one second magnetic dipole moment of the dipole moment matrix.

14. The system for creating dipole moment model of claim 12, wherein the coefficients of the first sub-filter and the coefficients of the second sub-filter are calculated by least square method.

15. The system for creating dipole moment model of claim 12, wherein if the near-field electric field and the near-field magnetic field are at a plane at a predetermined height above the tested circuit, the simulation electric field and the simulation magnetic field are at a plane at the predetermined height above the unit dipole moment.

16. The system for creating dipole moment model of claim 12, wherein the unit electric dipole moment and the first unit magnetic dipole moment are perpendicular to each other.

* * * * *